United States Patent
Kumar et al.

(10) Patent No.: US 11,831,477 B2
(45) Date of Patent: Nov. 28, 2023

(54) LINK TRAINING SCHEME FOR HIGH-SPEED SERIALIZER/DESERIALIZER

(71) Applicant: Dell Products L.P., Round Rock, TX (US)

(72) Inventors: Vijender Kumar, Bangalore (IN); Douglas Wallace, Round Rock, TX (US); Bhyrav Mutnury, Austin, TX (US); Sukumar Muthusamy, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/712,775

(22) Filed: Apr. 4, 2022

(65) Prior Publication Data

US 2023/0318886 A1 Oct. 5, 2023

(51) Int. Cl.
*H04B 1/16* (2006.01)
*H04L 25/03* (2006.01)

(52) U.S. Cl.
CPC .. *H04L 25/03878* (2013.01); *H04L 25/03063* (2013.01)

(58) Field of Classification Search
CPC . H04B 3/32; H04B 3/23; H04B 1/707; H04B 2201/709709; H04B 7/2668; H04B 7/204; H04L 25/03057; H04L 2025/0349; H04L 25/03267; H04L 2025/03617; H04L 25/03343; G01R 31/3008; G01R 31/31715; G01R 31/318594; G01R 31/3004; G01R 31/3016

USPC .......................................................... 375/233
See application file for complete search history.

(56) References Cited

U.S. PATENT DOCUMENTS

| 8,306,104 | B2 | 11/2012 | Agazzi et al. |
| 9,674,013 | B2 * | 6/2017 | Patel ................ H04L 25/03146 |
| 11,509,510 | B1 * | 11/2022 | Winterberg ....... H04L 25/03949 |
| 2002/0150155 | A1 | 10/2002 | Florentin et al. |
| 2013/0322506 | A1 * | 12/2013 | Zerbe .................... H04W 52/20 375/233 |
| 2019/0288881 | A1 * | 9/2019 | Berke ............... H04L 25/03267 |

* cited by examiner

*Primary Examiner* — Eva Y Puente
(74) *Attorney, Agent, or Firm* — Larson Newman, LLP

(57) ABSTRACT

An information handling system includes a first component including a transmitter for a high-speed serial data interface, and a second component including a receiver for the high-speed serial data interface. The receiver includes an equalization stage and a decision feedback equalization (DFE) stage. The equalization stage has an input to configure the equalization stage in one of a first low equalization state and a first high equalization state. The DFE stage has a plurality of tap inputs. The first component provides a plurality of training runs on the high-speed serial data interface. The second component receives the training runs, provides for each training run a set of tap settings for each tap input, determines whether or not a variation in the tap settings for the training runs is greater than a predetermined variation value, and, when the variation is greater than the predetermined variation value, sets the first input to configure the first equalization stage from the first low equalization state to the first high equalization state.

20 Claims, 3 Drawing Sheets

LINK TRAINING SCHEME FOR HIGH-SPEED SERIALIZER/DESERIALIZER

FIELD OF THE DISCLOSURE

This disclosure generally relates to information handling systems and more particularly relates to a link training scheme for high-speed serializer/deserializers.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a first component including a transmitter for a high-speed serial data interface, and a second component including a receiver for the high-speed serial data interface. The receiver may include an equalization stage and a decision feedback equalization (DFE) stage. The equalization stage may have an input to configure the equalization stage in one of a first low equalization state and a first high equalization state. The DFE stage may have a plurality of tap inputs. The first component may provide a plurality of training runs on the high-speed serial data interface. The second component may receive the training runs, provide for each training run a set of tap settings for each tap input, determine whether or not a variation in the tap settings for the training runs is greater than a predetermined variation value, and, when the variation is greater than the predetermined variation value, set the first input to configure the first equalization stage from the first low equalization state to the first high equalization state.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
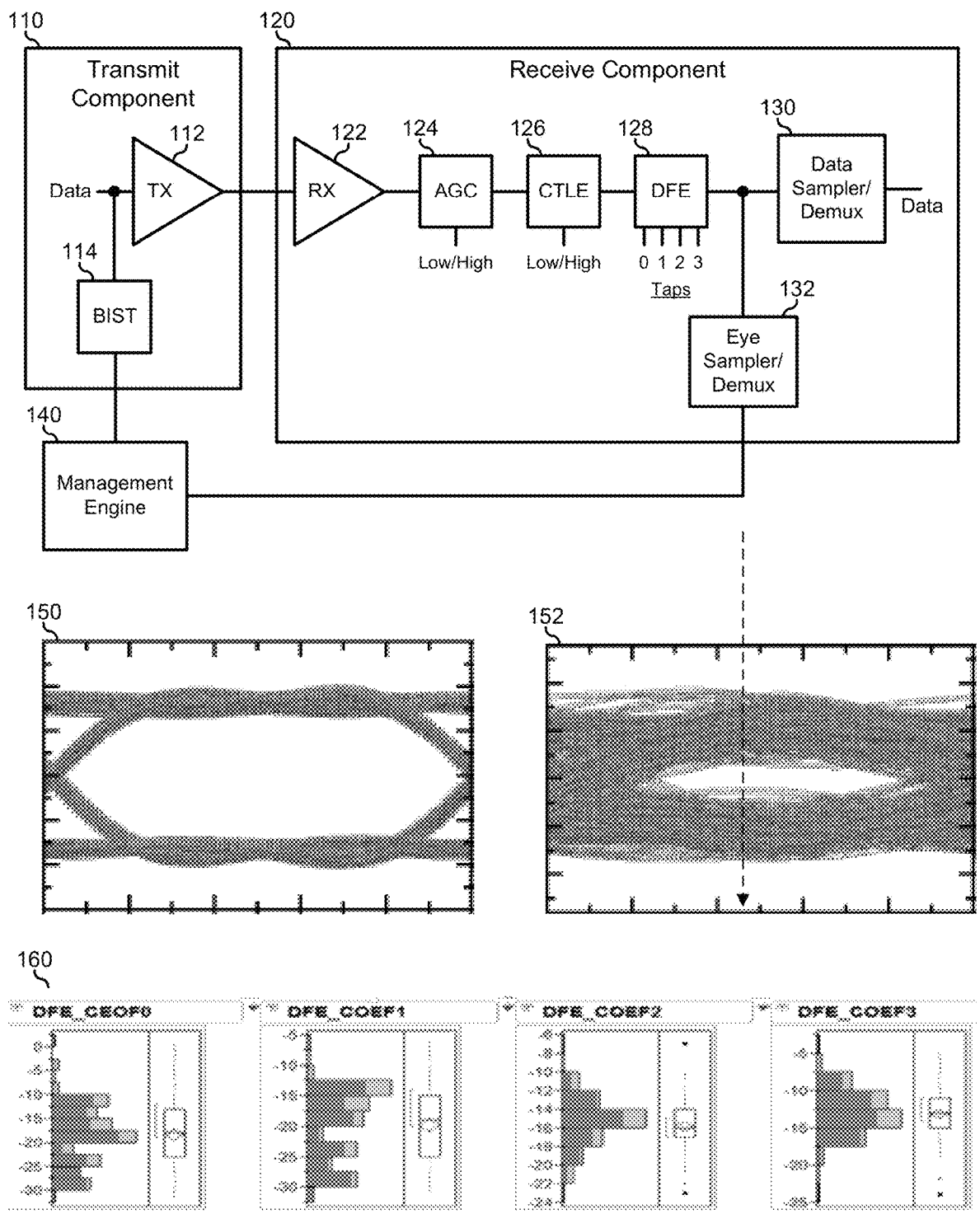
FIG. 1 is a block diagram of an information handling system according to an embodiment of the current disclosure.

FIG. 1 illustrates an information handling system 100 including a data transmitting component 110, a data receiving component 120, and a management engine 140. Data transmitting component 110 (hereinafter "transmitter 110") operates to transmit data via a high-speed data communication interface to and the data is received by data receiving component 120 (hereinafter "receiver 120"). The high-speed data communication interface may be a single-ended data communication interface, as here illustrated, where the data signals are provided over a single conductor and the data values are provided with reference to a common reference voltage, typically a ground level, or the high-speed data communication interface may be a double-ended data communication interface where the data signals are provided as differential signals over a pair of conductors, as needed or desired. Information handling system 100 represents a high-speed serializer/deserializer, in that transmitter 110 receives data and transmits the received data in a serialized fashion, and in that receiver 120 receives the serialized data from the transmitter and deserializes the data to extract the original data.

Examples of a high-speed data communication interface include a memory interface, such as a Double-Data Rate (DDR) interface, a Small Form Factor Pluggable (SFP+) interface for network communications, a Serial-ATA interface, a DisplayPort interface, a PCIe interface, a proprietary high-speed data communication interface, or the like. A typical high-speed data communication interface will include elements for bi-directional data communications. Thus, in a first case, a channel between a transmitter and a receiver may be utilized for bi-directional data transfers (for example DDR interfaces). Here, the typical transmitter component may include receive components as described herein that are coupled to the channel, and the typical receiver component may include transmit components as described herein that are coupled to the channel. In another case, a separate channel may be utilized for data transmission from the receiver component to the transmitter component (for example PCIe interfaces). The details of high-speed data communication interfaces are known in the art and will not be further described herein, except as needed to illustrate the current embodiments.

Transmitter 110 includes a physical layer transmitter 112 (hereinafter "transmit PHY 112") and a Built-In Self Test (BIST) module 114. In a normal data transmission operating mode, transmit PHY 112 receives data, and converts the received data into electrical signals on the channel to receiver 120. In some cases, such as in parallel bus type high-speed data communication interfaces, like DDR data communication interfaces, the data conversion may include a bit-by-bit translation of the received data bits into associated signals on the channel. In other cases, such as serial type high-speed data communication interfaces, like PCIe data communication interfaces, the data conversion may include an encoding step, such as an 8-bit/10-bit encoding, to ensure adequate state changes are received in the receiver for clock recovery or the like. The operation of BIST module 114 will be described further below.

Receiver 120 includes a physical layer receiver 122 (hereinafter "receive PHY 122"), an automatic gain control (AGC) module 124, a continuous-time liner equalization (CTLE) module 126, a decision feedback equalization (DFE) module 128, a data sampler/demultiplexor 130, and an eye sampler/demultiplexor 132. In the normal operating mode, receive PHY 122 receives the electrical signals from the channel. It will be understood that in a typical high-speed data communication interface, the data stream as provided to transmit PHY 112 is not simply "read" from an output of receive PHY 122. This is because the margins for voltage levels and the time duration of the received signals are so small that the distortion effects from the channel result in a received signal that is typically unrecognizable as data without significant post-processing to recover the data stream. As such, the output from receive PHY 122 is provided to the equalization blocks (e.g., AGC module 124, CTLE module 126, and DFE module 128) for processing, and the output of the equalization block is provided to data sampler/demultiplexor 130 before the data stream is recovered.

The equalization blocks operate to clean up the received signal from receive PHY 122 by compensating for the distortion effects from the channel. AGC module 124 is a feedback amplifier that operates to amplify the received signal from transmitter 110 to provide a constant level signal to the rest of the elements of receiver 120. ACG module 124 typically includes a fine gain input (not illustrated) that adjusts the amount of gain to be applied by the AGC module, and further includes a low/high-range input that selects a gain range over which the fine gain input operates. CTLE module 126 is a linear filter that attenuates low-frequency components of the signal received from AGC module 124 that amplifies components of the signal around the Nyquist frequency of the signal, and filters off high-frequency components of the signal. CTLE module 126 typically includes a fine attenuation input (not illustrated) that adjusts the amount of attenuation to be applied to the low- and high-frequency components by the CTLE module, and further includes a low/high-range input that selects an attenuation range over which the fine attenuation input operates. DFE module 128 is a non-linear equalization which relies on decisions about the levels of previous symbols (high/low) in the signal received from transmitter 110 in order to clean up a current symbol, thereby accounting for distortion in the current symbol that is caused by the previous symbols. As such, DFE module 128 is illustrated as including four taps (0, 1, 2, 3). Each tap is an input that applies a level of gain or attenuation to the current symbol based upon the respective first, second, third, and fourth previously detected symbols. The details of channel equalization, and in particular of AGC, CTLE, and DFE equalizations are known in the art and will not be further described herein, except as needed to illustrate the current embodiments. The result of the equalization by the equalization blocks is to present a clean data eye 150 to data sampler/demultiplexor 130 which extracts the data stream from the data eye for use by other elements of receiver 120 as needed or desired. The details of data recovery in a receiver of a high-speed data communication interface are known in the art and will not be further described herein, except as needed to illustrate the current embodiments.

Eye sampler/demultiplexor 132 is similar to data sampler/demultiplexor 130, and receives data eye 150. Here, data eye 150 represents a flow of data bits on the channel, and the depiction of the data eye, as shown in FIG. 1 is an instrument trace of multiple data bits from the data stream. As such, data sampler/demultiplexor 130 is focused upon extracting the individual data bits from the data stream, while eye sampler/demultiplexor 132 is focused on the issues of the quality of data eye 150, and particularly on determining the eye height and eye width of the data eye to ensure that sufficient margins are maintained as a result of the equalization process performed by equalization blocks.

In various embodiments, eye sampler/demultiplexor 132 operates in a training mode to provide feedback as to the sufficiency and consistency of the settings of the various stages of the equalization blocks in maintaining adequate margins in data eye 150 to improve the ability of data sampler/demultiplexor 130 to detect the data stream and to reduce the bit error rate of the detection process. In other embodiments, eye sampler/demultiplexor 132 operates in a run time mode to detect changes in data eye 150 and to proactively notify of the changes, or to amend the settings of the various stages of equalization blocks to maintain the bit error rate within satisfactory levels.

In a particular embodiment, in the training mode, eye sampler/demultiplexor 132 coordinates link training with transmitter 110. Here, management engine 140 operates to communicate training results from eye sampler/demultiplexor 132 to BIST module 114 to determine when the settings of the various stages of the equalization blocks have converged on a satisfactory set of values to create the adequate margins in data eye 150. Here, during a power-on phase, BIST module 114 operates to transmit training data via transmit PHY 112 and eye sampler/demultiplexor 132, upon detecting an unsatisfactory data eye 152, systematically adjusts the settings of the AGC gain, the CTLE gain/attenuation, and the DFE tap attenuation, until the detected eye exhibits the adequate margin to ensure that the bit error rate remains below a predetermined level. In another embodiment, the training is repeatedly performed. Here, it is understood that the same or similar settings for AGC module 124, CTLE module 126, and DFE module 128 will be expected, and eye sampler/multiplexor 132 selects as a final set of setting values the setting values that represent a best set of setting values. The best set of setting values can be determined as a most commonly reoccurring value for each setting, as an average of the values over the repeated training runs, as the value for each setting that exhibited the best eye margins, or other methods for analyzing the values of the repeated training runs.

It has been understood by the inventors of the current disclosure that, as the speeds of high-speed data communication interfaces increases, and the voltage margins are tightening, that the channels, including on-chip paths in the transmitter and receiver, circuit traces on the printed circuit board, connector interfaces, solder joints, and the like, are becoming more sensitive. On the other hand, traditional methods of testing and for establishing margins is becoming more constrained because the data signal at the device boundary, that is, at the device input contact, is not expected to resemble the bitstream without the post-processing performed by the equalization block. In other words, the introduction of an instrumented interposer and examining the signal trace at the interposer is too far removed from the end of the channel to be of much use. In particular, such measurement instruments are very artificial because the interposer is different from the device under test, and in any case, circuit sensitivity may be subject to system-to-system variations that make the conclusions drawn on one system inapplicable to other similar systems.

Further, the variation in the settings of the equalization blocks over repeated training runs may demonstrate a high consistency between training runs, and the selection of the best set of values can be a relatively straight forward process. On the other hand, due to uncertain conditions within information handling system 100, or due to the vagaries of board design or board manufacturing, some lanes may not exhibit a good convergence of the setting values across the various training runs. For example, tap settings 160 are illustrated for a high-speed data link that exhibits poor repeatability for the DFE settings for the four taps illustrated. In particular, DFE taps 0 and 1 (illustrated in FIG. 1 as "DFE_COEF0" and "DFE_COEF1") demonstrate that, over several training runs, the values for the tap settings were inconsistent, with no single tap value being a predominant setting value. Further, even though DFE taps 2 and 3 (illustrated in FIG. 1 as "DFE_COEF2" and "DFE_COEF3") exhibit a particular tap setting value that occurs most frequently, and the other tap setting values occur with decreasing frequency, such a wide range of DFE tap values as exhibited by DFE taps 2 and 3 would still be deemed to be to inconsistent to ensure that the selection of the predominant tap value would ensure that the link would consistently demonstrate good eye margins, and hence ensure a low bit error rate.

In a particular embodiment, receiver 120 operates to determine whether or not the variability of the tap settings of DFE module 128 over the several training runs is within an acceptable range. Here, tap settings 160 for the various runs are illustrated as a Pareto chart for each tap. In a particular embodiment, receiver 120 operates to perform a statistical analysis of run data, such as tap settings 160, to determine the variability of each tap setting. Then, when the variability is within than a predetermined threshold value, the converged setting values are utilized for the tap settings for DFE module 128, and the training sequence is completed. On the other hand, when the variability is greater than the predetermined value, receiver 120 operates to set the low/high range gain input to AGC module 124 to the high gain setting, to set the low/high range attenuation input to CTLE module 126 to the high attenuation setting, or to set both the low/high range gain input to the AGC module to the high gain setting and the low/high range attenuation input to the CTLE module to the high attenuation setting. Here further, receiver 120 operates to utilize the non-converged tap settings for DFE module 128, and the training sequence is completed. Here, it is understood that the non-converged tap settings may result in wider variances in the exhibited eye width and eye height. However, such wider variances may be understood to be offset by the wider eye width and higher eye height that results from the increased AGC gain and CTLE attenuation, thereby increasing the overall margin of information handling system 100. It will be further understood that increasing the AGC gain and the CTLE attenuation may result in a higher power draw from information handling system 100. As such, the teachings of the current disclosure may be understood to be utilized on a lane-by-lane basis, so that the overall power dissipation over multiple lanes is limited to only the lanes that exhibit the high variability in the DFE tap setting values.

Information handling system 100 includes management engine 140 that is connected to transmitter 110 and to receiver 120 to coordinate the operations of the information handling system in the test mode. In particular, management engine 140 operates to direct BIST module 114 to transmit the iterations of the training sequence test signal, and directs receiver 120 to evaluate resulting DFE tap values to determine the variability of the setting values as described above. Management engine 140 may include hooks into other elements of information handling system 100 to monitor, manage, and maintain the operations of the test mode.

In a particular embodiment, management engine 140 represents an in-band agent instantiated by a host processor of information handling system 100 that operates during a POST phase and reports the results of the training sequence to a BIOS/UEFI of the information handling system, to a user of the information handling system, to an event logger of the information handling system, or the like. In another embodiment, management engine 140 represents an out-of-band element of information handling system 100, such as a Baseboard Management Controller (BMC) or the like, that is connected to a management system (not illustrated) for the information handling system. In a particular embodiment, management engine 140 operates to log the performance of the channel for future reference, and then, in subsequent instances of the test mode, the management engine can compare the performance information with past performance information to detect changes in the performance.

Figure 2:
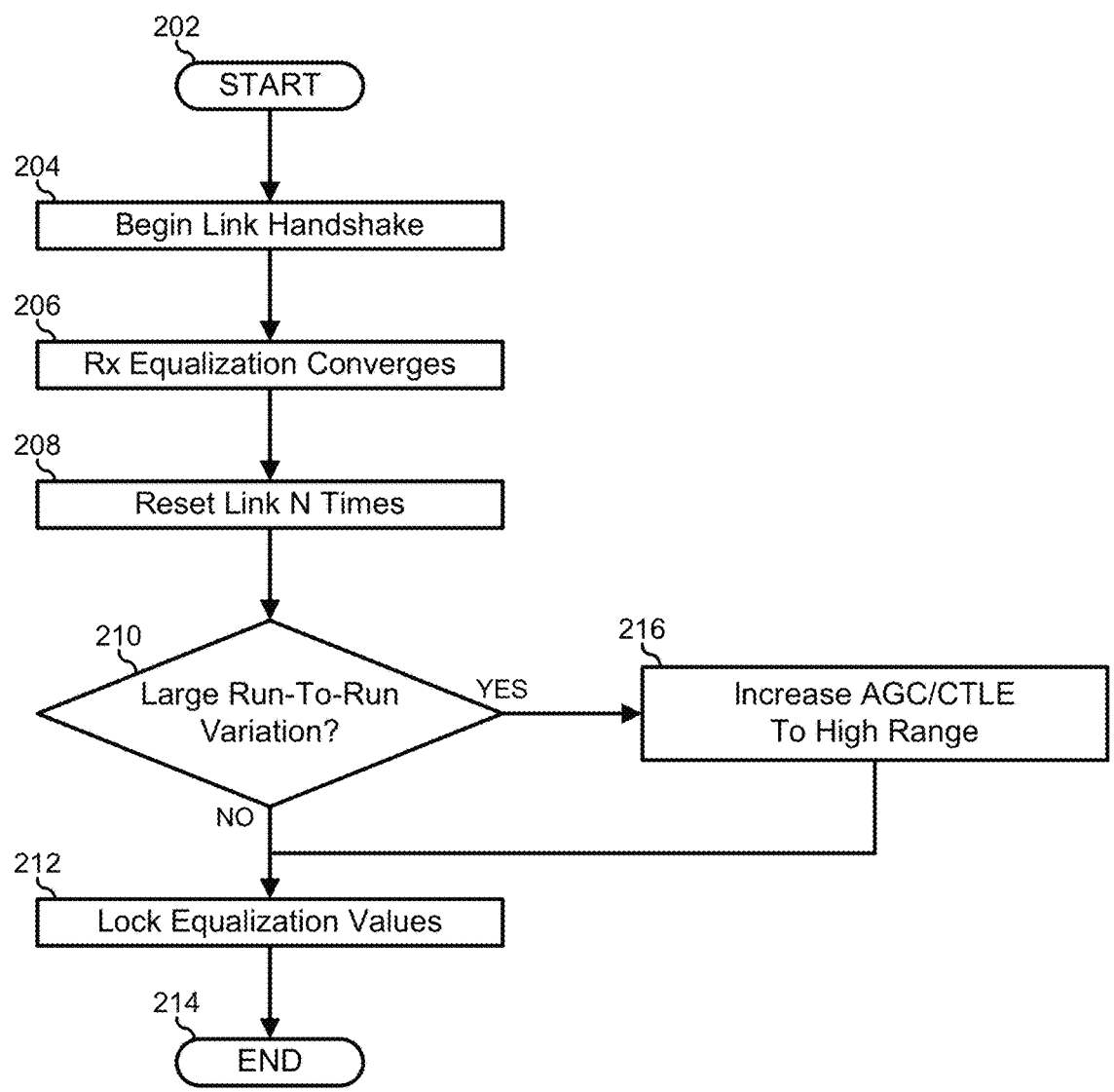
FIG. 2 is a flowchart illustrating a method for link training for high-speed serializer/deserializers according to an embodiment of the current disclosure.

FIG. 2 illustrates a method 200 for link training for high-speed serializer/deserializers, starting at block 202. A data communication link begins a training sequence with a link handshake and link training is initiated in block 204. The link training determines a converged set of equalization values for a DFE module in the data communication link receiver in block 206. The link training is repeated a predetermined "N" number of times in block 208. A decision is made as to whether or not the variability of the converged equalization values is greater than a predetermined value in decision block 210. If not, the "NO" branch of decision block 210 is taken, the converged set of equalization values is locked in for the data communication link in block 212, and the method ends in block 214. If the variability of the converged equalization values is greater than a predetermined value, the "YES" branch of decision block 210 is taken, the AGC and CTLE modules in the data communication link receiver are set to their high range in block 216, and the method proceeds to block 212, where the set of equalization values is locked in for the data communication link, and the method ends in block 214.

Figure 3:
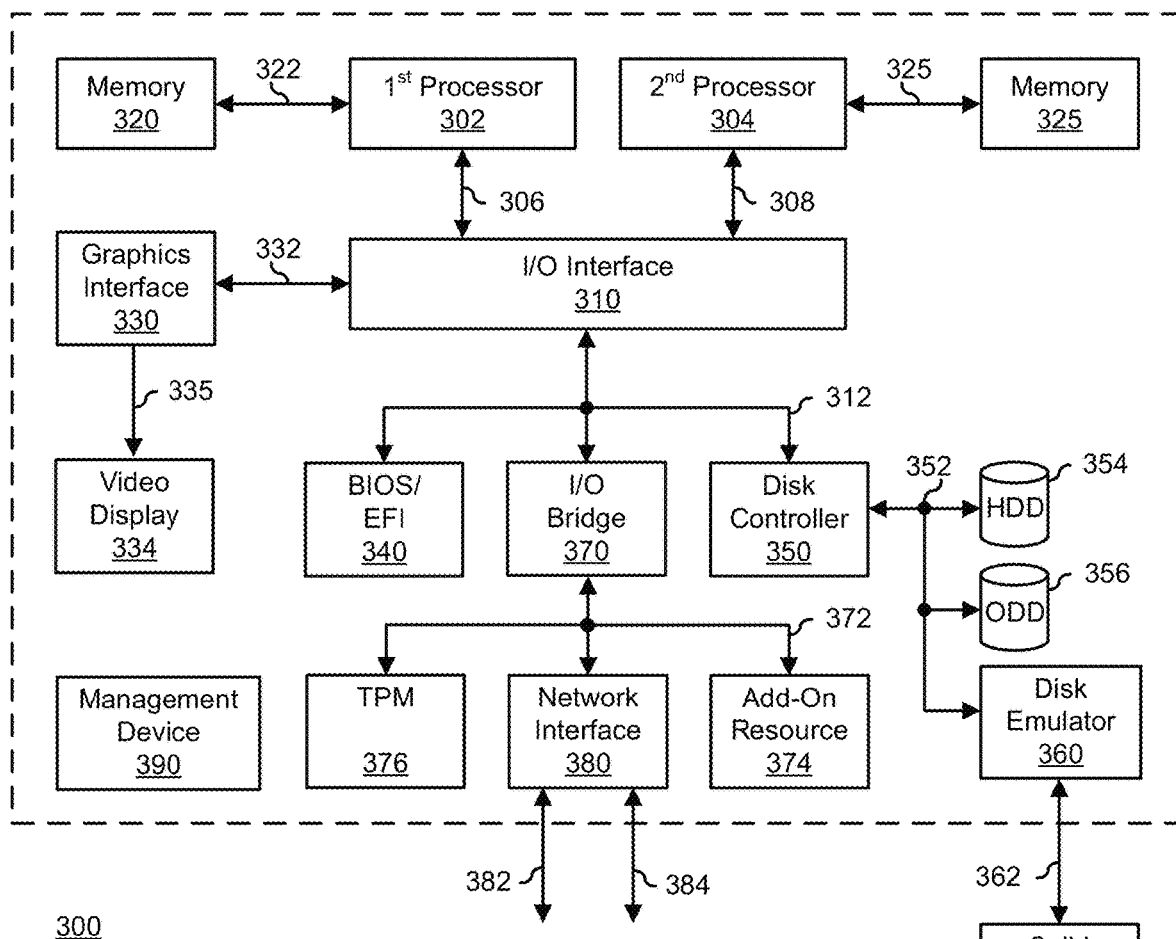
FIG. 3 is a block diagram illustrating a generalized information handling system according to another embodiment of the present disclosure.

FIG. 3 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 362, an I/O bridge 370, one or more add-on resources 374, a trusted platform module (TPM) 376, a network interface 380, a management device 390, and a power supply 395. Processors 302 and 304, I/O interface 310, memory 320, graphics interface 330, BIOS/UEFI module 340, disk controller 350, HDD 354, ODD 356, disk emulator 360, SSD 362, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 336 to a video display 334. In a particular embodiment, information handling system 300 includes separate memories that are dedicated to each of processors 302 and 304 via separate memory interfaces. An example of memories 320 and 330 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
   a first component including a transmitter for a high-speed serial data interface; and
   a second component including a receiver for the high-speed serial data interface, the receiver including a first equalization stage and a decision feedback equalization (DFE) stage, the first equalization stage having a first input to provide a first fine scale adjustment to the first equalization stage and a second input to scale the first fine scale adjustment in one of a first low equalization state and a first high equalization state, and the DFE stage having a plurality of tap inputs;
   wherein:
   the first component is configured in a training mode for the high-speed serial data interface to provide a plurality of training runs on the high-speed serial data interface; and
   the second component is configured in the training mode to receive the training runs, to provide for each training run a fine adjustment to the first input and a set of tap settings for each tap input, to determine whether or not a variation in the tap settings for the training runs is greater than a predetermined variation value, and, when the variation is greater than the predetermined variation value, to set the second input to configure the first fine scale adjustment from the first low equalization state to the first high equalization state.

2. The information handling system of claim 1, wherein the first equalization stage is an automatic gain control stage.

3. The information handling system of claim 2, wherein the low equalization state is a low gain state and the high equalization state is a high gain state.

4. The information handling system of claim 1, wherein the first equalization stage is a continuous-time linear equalization stage.

5. The information handling system of claim 4, wherein the low equalization state is a low attenuation state and the high equalization state is a high gain state.

6. The information handling system of claim 1, wherein the receiver further includes a second equalization stage having a third input to provide a second fine scale adjustment to the second equalization stage and a fourth input to scale the second fine scale adjustment in one of a second low equalization state and a second high equalization state.

7. The information handling system of claim 6, wherein, when the variation is greater than the predetermined variation value, the second component is further configured to set the fourth input to configure the second equalization stage from the second low equalization state to the second high equalization state.

8. The information handling system of claim 6, wherein, when the variation is greater than the predetermined variation value, the second component is further configured to set the fourth input to configure the second equalization stage to retain the second low equalization state.

9. The information handling system of claim 1, further comprising:
   a baseboard management controller configured to initiate the training mode.

10. The information handling system of claim 9, wherein the baseboard management controller is further configured to receive an indication from the second component that the variation is greater than the predetermined variation value, and to log that the first input is set to configure the first equalization stage from the first low equalization state to the first high equalization state.

11. A method, comprising:
    providing, in a first component of an information handling system, a transmitter for a high-speed serial data interface;
    providing, in a second component of the information handling system, a receiver for the high-speed serial data interface, the receiver including a first equalization stage and a decision feedback equalization (DFE) stage, the first equalization stage having a first input to provide a first fine scale adjustment to the first equalization stage and a second input to scale the first fine scale adjustment in one of a first low equalization state and a first high equalization state, and the DFE stage having a plurality of tap inputs;

providing, by the first component in a training mode for the high-speed serial data interface, a plurality of training runs on the high-speed serial data interface;

receiving, by the second component in the training mode, the training runs;

providing, for each training run, a fine adjustment to the first input and a set of tap settings for each tap input;

determining whether or not a variation in the tap settings for the training runs is greater than a predetermined variation value; and when the variation is greater than the predetermined variation value, setting the second input to configure the first equalization stage from the first low equalization state to the first high equalization state.

12. The method of claim 11, wherein the first equalization stage is an automatic gain control stage.

13. The method of claim 12, wherein the low equalization state is a low gain state and the high equalization state is a high gain state.

14. The method of claim 11, wherein the first equalization stage is a continuous-time linear equalization stage.

15. The method of claim 14, wherein the low equalization state is a low attenuation state and the high equalization state is a high gain state.

16. The method of claim 11, wherein the receiver further includes a second equalization stage having a third input to provide a second fine scale adjustment to the second equalization stage and a fourth input to scale the second fine scale adjustment in one of a second low equalization state and a second high equalization state.

17. The method of claim 16, wherein, when the variation is greater than the predetermined variation value, the method further comprises:

setting the fourth input to configure the second equalization stage from the second low equalization state to the second high equalization state.

18. The method of claim 16, wherein, when the variation is greater than the predetermined variation value, the method further comprises:

setting the fourth input to configure the second equalization stage to retain the second low equalization state.

19. The method of claim 11, further comprising:

receiving, by a baseboard management controller of the information handling system, an indication from the second component that the variation is greater than the predetermined variation value: and logging that the first input is set to configure the first equalization stage from the first low equalization state to the first high equalization state.

20. An information handling system, comprising:

a first component including a transmitter for a high-speed serial data interface; and a second component including a receiver for the high-speed serial data interface, the receiver including an automatic gain control (AGC) stage, a continuous-time linear equalization (CTLE) stage, and a decision feedback equalization (DFE) stage, the AGC stage having a first input to configure the AGC stage in one of a low gain state and a high gain state, the CTLE stage having a second input to configure the CTLE stage in one of a low attenuation state and a high attenuation state, and the DFE stage having a plurality of tap inputs;

wherein:

the first component is configured in a training mode for the high-speed serial data interface to provide a plurality of training runs on the high-speed serial data interface; and the second component is configured in the training mode to receive the training runs, to provide for each training run a set of tap settings for each tap input, to determine whether or not a variation in the tap settings for the training runs is greater than a predetermined variation value, and, when the variation is greater than the predetermined variation value, to 1) set the first input to configure the AGC stage from the low gain state to the high gain state, and 2) set the second input to configure the CTLE stage from the low attenuation state to the high attenuation state.

* * * * *